United States Patent
Liu et al.

(10) Patent No.: US 11,380,280 B2
(45) Date of Patent: Jul. 5, 2022

(54) SHIFT REGISTER AND DRIVING METHOD EFFECTIVELY AVOIDING THRESHOLD VALUE DRIFT OF THIN FILM TRANSISTOR AND BETTER NOISE REDUCTION

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Jinliang Liu, Beijing (CN); Miao Zhang, Beijing (CN); Wuxia Fu, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 281 days.

(21) Appl. No.: 16/609,802

(22) PCT Filed: Apr. 29, 2019

(86) PCT No.: PCT/CN2019/085049
§ 371 (c)(1),
(2) Date: Oct. 31, 2019

(87) PCT Pub. No.: WO2019/210830
PCT Pub. Date: Nov. 7, 2019

(65) Prior Publication Data
US 2021/0335317 A1  Oct. 28, 2021

(30) Foreign Application Priority Data
May 4, 2018 (CN) .......................... 201810419917.3

(51) Int. Cl.
G09G 3/36 (2006.01)
G11C 19/28 (2006.01)

(52) U.S. Cl.
CPC .......... *G09G 3/3696* (2013.01); *G11C 19/28* (2013.01); *G09G 2300/0426* (2013.01); *G09G 2310/08* (2013.01); *G09G 2320/045* (2013.01)

(58) Field of Classification Search
CPC ...... G09G 3/36; G09G 3/3611; G09G 3/3622; G09G 3/3625; G09G 3/3648;
(Continued)

(56) References Cited

U.S. PATENT DOCUMENTS 10,204,587 B2 * 2/2019 Chen ...................... G11C 19/28
10,431,143 B2 * 10/2019 Zhang .................. G11C 19/184
(Continued)

FOREIGN PATENT DOCUMENTS

CN   103714780 A    4/2014
CN   105741740 A    7/2016
(Continued)

OTHER PUBLICATIONS

Chinese Office Action dated Aug. 15, 2019 corresponding to application No. 201810419917.3.

*Primary Examiner* — Alexander Eisen
*Assistant Examiner* — Nelson Lam
(74) *Attorney, Agent, or Firm* — Nath, Goldberg & Meyer; Joshua B. Goldberg

(57) ABSTRACT

Provided are shift register, driving method thereof, gate driving circuit and display device. The shift register includes input circuit, pull-up circuit, reset circuit, at least one noise reduction circuit, and at least one pull-down node control circuit. At least one pull-down node control circuit is coupled to at least one pull-down node, low voltage signal terminal, and reset signal terminal, and configured to control voltage level of at least one pull-down node according to signal of reset signal terminal. At least one pull-down node control circuit controls level of at least one pull-down node to second level higher than or equal to on level in response to signal of reset signal terminal having on level, and controls voltage level of at least one pull-down node to third level between on level and first level in response to signal of reset signal terminal transitioning from on level to off level.

18 Claims, 6 Drawing Sheets

(58) Field of Classification Search
CPC .. G09G 3/3677; G09G 3/3681; G09G 3/3688; G09G 3/3692; G09G 3/3696
USPC .................................................. 345/87–104
See application file for complete search history.

(56) References Cited

U.S. PATENT DOCUMENTS

| | | | |
|---|---|---|---|
| 11,132,934 B2* | 9/2021 | Xie ........................... | G09G 3/20 |
| 2013/0342516 A1* | 12/2013 | Shang .................. | G09G 3/3677 345/206 |
| 2016/0307641 A1* | 10/2016 | Zheng .................. | G09G 3/3677 |
| 2017/0018243 A1* | 1/2017 | Huang ..................... | G09G 3/36 |
| 2017/0032752 A1* | 2/2017 | Huang .................. | G11C 19/28 |
| 2017/0039971 A1* | 2/2017 | Huang ................. | G11C 19/184 |
| 2017/0199617 A1* | 7/2017 | Gu ....................... | G06F 3/04184 |
| 2017/0309240 A1* | 10/2017 | Zhang .................. | G11C 19/287 |
| 2019/0139475 A1* | 5/2019 | Wang .................. | G09G 3/3674 |
| 2020/0098441 A1* | 3/2020 | Zhang .................. | G11C 19/287 |

FOREIGN PATENT DOCUMENTS

| | | |
|---|---|---|
| CN | 106448600 A | 2/2017 |
| CN | 106652875 A | 5/2017 |
| CN | 107527587 A | 12/2017 |
| CN | 108564930 A | 9/2018 |
| KR | 10-2017-0078165 A | 7/2017 |

\* cited by examiner

SHIFT REGISTER AND DRIVING METHOD EFFECTIVELY AVOIDING THRESHOLD VALUE DRIFT OF THIN FILM TRANSISTOR AND BETTER NOISE REDUCTION

CROSS-REFERENCE TO RELATED APPLICATION

This is a National Phase Application filed under 35 U.S.C. 371 as a national stage of PCT/CN2019/085049, filed on Apr. 29, 2019, an application claiming priority to Chinese Patent Application No. 201810419917.3, filed on May 4, 2018 in the China National Intellectual Property Administration, the contents of which are incorporated herein by reference in the entirety.

TECHNICAL FIELD

The present application belongs to the technical field of display, and particularly relates to a shift register, a driving method thereof, a gate driving circuit and a display device.

BACKGROUND

In the field of liquid crystal displays, a gate-on-array (GOA) circuit in which a gate driving circuit is integrated with a liquid crystal panel has been widely used. In the GOA circuit, the gate driving circuit, which takes place of a conventional gate driving integrated circuit, is integrated on an array substrate, thereby having the advantages of reducing costs, reducing production processes and the like.

In general, the GOA circuit is a progressively scanning circuit, in which signals need to be reset when outputting to a certain row is completed. After the reset is completed, noise reduction is also required in order to avoid noise output. However, in the conventional GOA circuit, a threshold voltage Vth of a thin film transistor (TFT) in the noise reduction circuit gradually drifts.

SUMMARY

In one aspect, the present application provides a shift register including: an input circuit coupled to an input signal terminal and a pull-up node, and configured to provide a signal of the input signal terminal to the pull-up node; a pull-up circuit coupled to a clock signal terminal, an output signal terminal and the pull-up node, and configured to provide a signal of the clock signal terminal to the output signal terminal under control of the pull-up node; a reset circuit coupled to a reset signal terminal, the pull-up node, the output signal terminal, and a low voltage signal terminal, and configured to provide a signal of the low voltage signal terminal to the output signal terminal and the pull-up node under control of a signal of the reset signal terminal, the signal of the low voltage signal terminal having a constant first level; at least one noise reduction circuit coupled to a modulation voltage signal terminal, the low voltage signal terminal, the output signal terminal, the pull-up node, and at least one pull-down node, and configured to control the at least one pull-down node according to a signal of the modulation voltage signal terminal and a signal of the pull-up node, and provide the signal of the low voltage signal terminal to the output signal terminal and the pull-up node under control of the at least one pull-down node; and at least one pull-down node control circuit coupled to the at least one pull-down node, the low voltage signal terminal, and the reset signal terminal, and configured to control a voltage level of the at least one pull-down node according to the signal of the reset signal terminal. The at least one pull-down node control circuit controls the voltage level of the at least one pull-down node to a second level higher than or equal to an on level in response to the signal of the reset signal terminal having the on level, and controls the voltage level of the at least one pull-down node to a third level between the on level and the first level in response to the signal of the reset signal terminal transitioning from the on level to an off level.

In some embodiments, the at least one noise reduction circuit provides the signal of the low voltage signal terminal to the output signal terminal and the pull-up node in response to the voltage level of the at least one pull-down node being at the third level.

In some embodiments, the at least one pull-down node includes a first pull-down node. The at least one pull-down node control circuit includes a first pull-down node control circuit coupled to the first pull-down node, the low voltage signal terminal, and the reset signal terminal, and configured to control a voltage level of the first pull-down node according to the signal of the reset signal terminal. The at least one noise reduction circuit includes a first noise reduction circuit including: a first modulation sub-circuit coupled to a first modulation voltage signal terminal and the first pull-down node, and configured to provide a signal of the first modulation voltage signal terminal to the first pull-down node; a first suppression sub-circuit coupled to the pull-up node, the first pull-down node, and the low voltage signal terminal, and configured to provide the signal of the low voltage signal terminal to the first pull-down node under control of the pull-up node; and a first noise reduction sub-circuit coupled to the first pull-down node, the pull-up node, the low voltage signal terminal and the output signal terminal, and configured to provide the signal of the low voltage signal terminal to the output signal terminal and the pull-up node under control of the first pull-down node.

In some embodiments, the first pull-down node control circuit includes: an eleventh transistor having a gate electrode and a second electrode coupled to the first pull-down node, and a first electrode coupled to the low voltage signal terminal; and a second capacitor having a first end coupled to the first pull-down node, and a second end coupled to the reset signal terminal.

In some embodiments, the first modulation sub-circuit includes a fifth transistor having a gate electrode and a first electrode coupled to the first modulation voltage signal terminal, and a second electrode coupled to the first pull-down node. The first suppression sub-circuit includes a seventh transistor having a gate electrode coupled to the pull-up node, a first electrode coupled to the low voltage signal terminal, and a second electrode coupled to the first pull-down node. The first noise reduction sub-circuit includes: a tenth transistor having a gate electrode coupled to the first pull-down node, a first electrode coupled to the low voltage signal terminal, and a second electrode coupled to the pull-up node; and a sixteenth transistor having a gate electrode coupled to the first pull-down node, a first electrode coupled to the low voltage signal terminal, and a second electrode coupled to the output signal terminal.

In some embodiments, the at least one pull-down node further includes a second pull-down node. The at least one pull-down node control circuit further includes a second pull-down node control circuit coupled to the second pull-down node, the low voltage signal terminal, and the reset signal terminal, and configured to control a voltage level of the second pull-down node according to the signal of the reset signal terminal. The at least one noise reduction circuit further includes a second noise reduction circuit including: a second modulation sub-circuit coupled to a second modulation voltage signal terminal and the second pull-down node, and configured to provide a signal of the second modulation voltage signal terminal to the second pull-down node; a second suppression sub-circuit coupled to the pull-up node, the second pull-down node, and the low voltage signal terminal, and configured to provide the signal of the low voltage signal terminal to the second pull-down node under control of the pull-up node; and a second noise reduction sub-circuit coupled to the pull-up node, the second pull-down node, the low voltage signal terminal and the output signal terminal, and configured to provide the signal of the low voltage signal terminal to the output signal terminal and the pull-up node under control of the second pull-down node.

In some embodiments, the signal of the first modulation voltage signal terminal has a waveform inverse to that of the signal of the second modulation voltage signal terminal.

In some embodiments, the second pull-down node control circuit includes: an eighteenth transistor having a gate electrode and a second electrode coupled to the second pull-down node, and a first electrode coupled to the low voltage signal terminal; and a third capacitor having a first end coupled to the second pull-down node, and a second end coupled to the reset signal terminal.

In some embodiments, the first modulation sub-circuit includes a fifth transistor and a sixth transistor. The fifth transistor has a gate electrode coupled to a second electrode of the sixth transistor, a first electrode coupled to the first modulation voltage signal terminal, and a second electrode coupled to the first pull-down node; and the sixth transistor has a gate electrode and a first electrode coupled to each other, and the first electrode of the sixth transistor is coupled to the first modulation voltage signal terminal. The first suppression sub-circuit includes a seventh transistor and an eighth transistor. The seventh transistor has a gate electrode coupled to the pull-up node, a first electrode coupled to the low voltage signal terminal, and a second electrode coupled to the first pull-down node; and the eighth transistor has a gate electrode coupled to the pull-up node, a first electrode coupled to the low voltage signal terminal, and a second electrode coupled to the second electrode of the sixth transistor. The first noise reduction sub-circuit includes a tenth transistor and a sixteenth transistor. The tenth transistor has a gate electrode coupled to the first pull-down node, a first electrode coupled to the low voltage signal terminal, and a second electrode coupled to the pull-up node; and the sixteenth transistor has a gate electrode coupled to the first pull-down node, a first electrode coupled to the low voltage signal terminal, and a second electrode coupled to the output signal terminal. The second modulation sub-circuit includes a twelfth transistor and a thirteenth transistor. The twelfth transistor has a gate electrode coupled to a second electrode of the thirteenth transistor, a first electrode coupled to the second modulation voltage signal terminal, and a second electrode coupled to the second pull-down node; and the thirteenth transistor has a gate electrode and a first electrode coupled to each other, and the first electrode of the thirteenth transistor is coupled to the second modulation voltage signal terminal. The second suppression sub-circuit includes a fourteenth transistor and a fifteenth transistor. The fourteenth transistor has a gate electrode coupled to the pull-up node, a first electrode coupled to the low voltage signal terminal, and a second electrode coupled to the second pull-down node; and the fifteenth transistor has a gate electrode coupled to the pull-up node, a first electrode coupled to the low voltage signal terminal, and a second electrode coupled to the second electrode of the thirteenth transistor. The second noise reduction sub-circuit includes a ninth transistor and a seventeenth transistor. The ninth transistor has a gate electrode coupled to the second pull-down node, a first electrode coupled to the low voltage signal terminal, and a second electrode coupled to the pull-up node; and the seventeenth transistor has a gate electrode coupled to the second pull-down node, a first electrode coupled to the low voltage signal terminal, and a second electrode coupled to the output signal terminal.

In some embodiments, the input circuit includes a first transistor having a gate electrode and a first electrode coupled to the input signal terminal and a second electrode coupled to the pull-up node.

In some embodiments, the pull-up circuit includes a third transistor and a first capacitor. The third transistor has a gate electrode coupled to the pull-up node, a first electrode coupled to the clock signal terminal, and a second electrode coupled to the output signal terminal; and the first capacitor has a first end coupled to the pull-up node, and a second end coupled to the output signal terminal.

In some embodiments, the reset circuit includes a first reset sub-circuit and a second reset sub-circuit, the first reset sub-circuit includes a second transistor, and the second reset sub-circuit includes a fourth transistor. The second transistor has a gate electrode coupled to the reset signal terminal, a first electrode coupled to the low voltage signal terminal, and a second electrode coupled to the pull-up node; and the fourth transistor has a gate electrode coupled to the reset signal terminal, a first electrode coupled to the low voltage signal terminal, and a second electrode coupled to the output signal terminal.

In another aspect, the present application provides a method of driving a shift register. The shift register includes: an input circuit coupled to an input signal terminal and a pull-up node, and configured to provide a signal of the input signal terminal to the pull-up node; a pull-up circuit coupled to a clock signal terminal, an output signal terminal and the pull-up node, and configured to provide a signal of the clock signal terminal to the output signal terminal under control of the pull-up node; a reset circuit coupled to a reset signal terminal, the pull-up node, the output signal terminal, and a low voltage signal terminal, and configured to provide a signal of the low voltage signal terminal to the output signal terminal and the pull-up node under control of a signal of the reset signal terminal, the signal of the low voltage signal terminal having a constant first level; at least one noise reduction circuit coupled to a modulation voltage signal terminal, the low voltage signal terminal, the output signal terminal, the pull-up node, and at least one pull-down node, and configured to control the at least one pull-down node according to a signal of the modulation voltage signal terminal and a signal of the pull-up node, and provide the signal of the low voltage signal terminal to the output signal terminal and the pull-up node under control of the at least one pull-down node; and at least one pull-down node control circuit coupled to the at least one pull-down node, the low voltage signal terminal, and the reset signal terminal, and configured to control a voltage level of the at least one pull-down node according to the signal of the reset signal terminal. The method includes: in a pull-up phase, providing an on level through the input signal terminal, and pulling up the pull-up node through the input circuit; in an output phase, providing the on level through the clock signal terminal, and outputting a shift signal with the on level through the output signal terminal; in a noise reduction initial phase, providing the on level through the reset signal terminal, resetting the pull-up node and the output signal terminal through the at least one noise reduction circuit, and controlling, by the at least one pull-down node control circuit, the at least one pull-down node to be at a second level higher than or equal to the on level; and in a noise reduction maintaining phase, controlling, by the at least one pull-down node control circuit, the at least one pull-down node to be at a third level, the third level being between the first level and the on level.

In another aspect, the present application provides a gate driving circuit including N cascaded shift registers described above.

In another aspect, the present application provides a display device including the above gate driving circuit.

DETAILED DESCRIPTION

To make those skilled in the art better understand the technical solutions of the present disclosure, a shift register and a driving method thereof, a gate driving circuit and a display device according to embodiments of the present disclosure will be further described in detail below in conjunction with the accompanying drawings and specific embodiments.

Herein, an "on level" refers to a level that turns on a thin film transistor when the level is used to drive the thin film transistor, and an "off level" refers to a level that turns off a thin film transistor when the level is used to drive the thin film transistor. For example, for an N-type thin film transistor, the on level is a high level and the off level is a low level.

The GOA circuit consists of a plurality of cascaded shift registers, so that the display panel can be driven row by row. In general, when the outputting to a certain row is completed, a shift register in a GOA circuit needs to be reset. When the reset is completed, the shift register also needs to denoise important nodes such as output nodes and/or pull-up nodes in order to avoid noise outputs.

In the conventional shift register applied to the GOA circuit, a gate electrode of a thin film transistor (TFT) in the noise reduction circuit is affected by the long-term pulse, which makes the threshold voltage Vth of the TFT gradually drift. For example, when a high-level signal is applied to the gate electrode of the TFT for a long period of time, the threshold voltage Vth of the TFT drifts seriously. In order to avoid the influence of Vth drift in the noise reduction circuit on the output signal of the shift register, the size of the corresponding TFT in the noise reduction circuit needs to be large. However, the large size of the TFT increases the occupation area of the shift register, thereby making it difficult to achieve a narrow bezel of the display panel.

The embodiments of the present disclosure provide a shift register and a corresponding driving method thereof, which can effectively avoid threshold value drift of a thin film transistor in the shift register and provide better noise reduction effect.

Figure 1:
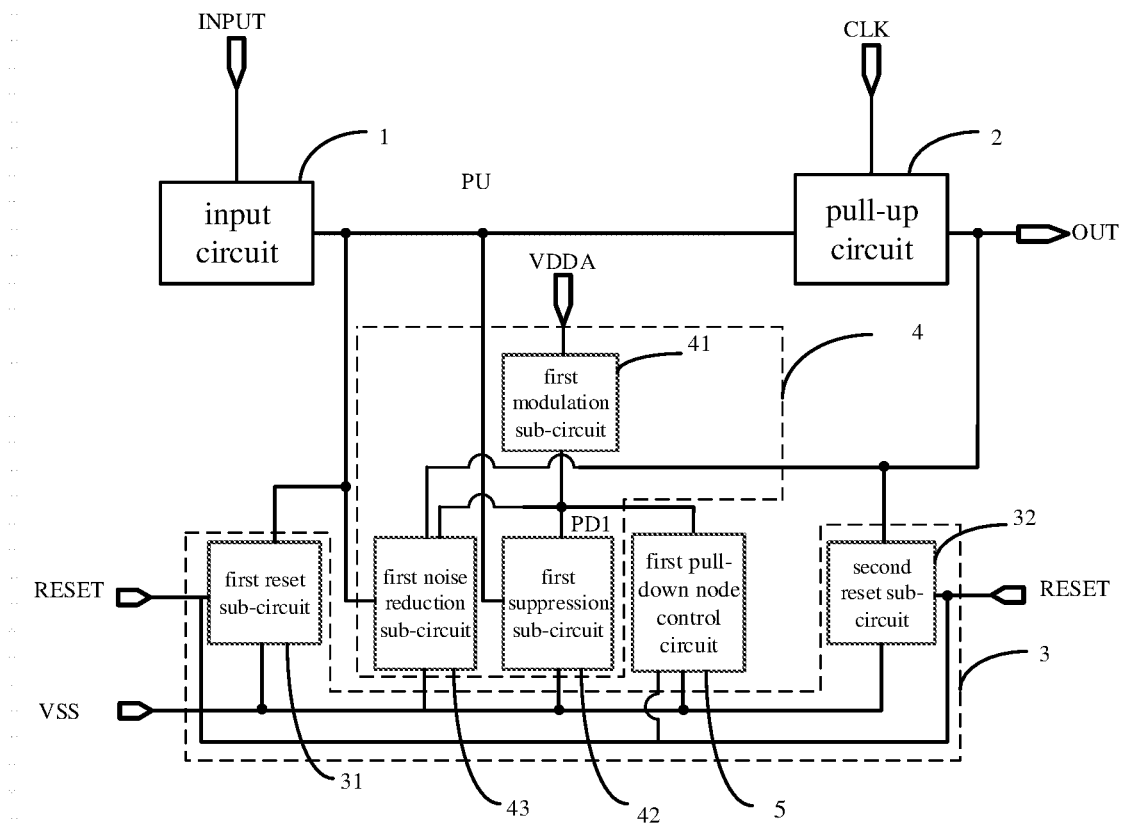
FIG. 1 is a block diagram of a shift register in an embodiment of the present disclosure.

As shown in FIG. 1, the shift register includes an input circuit 1, a pull-up circuit 2, a reset circuit 3, a noise reduction circuit 4, and a first pull-down node control circuit 5.

The input circuit 1 is coupled to an input signal terminal INPUT and a pull-up node PU, and configured to provide a signal of the input signal terminal INPUT to the pull-up node PU, that is, to charge the pull-up node under the control of the input signal, thereby pulling up the pull-up node.

The pull-up circuit 2 is coupled to a clock signal terminal CLK, an output signal terminal OUT, and the pull-up node PU, and configured to provide a signal of the clock signal terminal CLK to the output signal terminal OUT under the control of the pull-up node PU, thereby outputting a shift signal and pulling up the pull-up node signal for a second time.

The reset circuit 3 is coupled to the reset signal terminal RESET, the output signal terminal OUT, the pull-up node PU, and the low voltage signal terminal VSS, and configured to provide a signal of the low voltage signal terminal VSS to the output signal terminal OUT and the pull-up node PU under the control of a signal of the reset signal terminal RESET, thereby resetting the output signal terminal OUT and the pull-up node PU to a low level. The signal of the low voltage signal terminal VSS has a constant first level (e.g., a low level or an off level).

The noise reduction circuit 4 is coupled to a modulation voltage signal terminal VDDA, the low voltage signal terminal VSS, the output signal terminal OUT, the pull-up node PU, and a first pull-down node PD1, and configured to control the first pull-down node PD1 according to signals of the modulation voltage signal terminal VDDA and the pull-up node PU, and provide the signal of the low voltage signal terminal VSS to the output signal terminal OUT and the pull-up node PU under the control of the first pull-down node PD1, thereby continuously setting the output signal terminal OUT and the pull-up node PU to a low level after the reset operation.

The first pull-down node control circuit 5 is coupled to the first pull-down node PD1, the low voltage signal terminal VSS and the reset signal terminal RESET, and configured to control a level of the first pull-down node PD1 according to the signal of the reset signal terminal RESET. The first pull-down node control circuit 5 controls the voltage level of the first pull-down node PD1 to a second level higher than or equal to an on level when the signal of the reset signal terminal RESET has the on level, and controls the voltage level of the first pull-down node PD1 to a third level between the on level and the first level when the signal of the reset signal terminal RESET transitions from the on level to an off level.

Hereinafter, each circuit in FIG. 1 will be described in detail with reference to the schematic circuit diagram of FIG. 2.

The input circuit 1 includes a first transistor M1 having a gate electrode and a first electrode coupled to the input signal terminal INPUT, and a second electrode coupled to the pull-up node PU.

The pull-up circuit 2 includes a third transistor M3 and a first capacitor C1. The third transistor M3 has a gate electrode coupled to the pull-up node PU, a first electrode coupled to the clock signal terminal CLK, and a second electrode coupled to the output signal terminal OUT; and the first capacitor C1 has a first end coupled to the pull-up node PU, and a second end coupled to the output signal terminal OUT.

The reset circuit 3 includes a first reset sub-circuit 31 and a second reset sub-circuit 32. The first reset sub-circuit 31 is coupled to the reset signal terminal RESET, the pull-up node PU, and the low voltage signal terminal VSS, and configured to reset the pull-up node PU under the control of a reset signal of the reset signal terminal RESET. The second reset sub-circuit 32 is coupled to the reset signal terminal RESET, the output signal terminal PU, and the low voltage signal terminal VSS, and configured to reset the output signal terminal OUT under the control of the reset signal of the reset signal terminal RESET.

The first reset sub-circuit 31 includes a second transistor M2, a gate electrode of the second transistor M2 is coupled to the reset signal terminal RESET, a first electrode of the second transistor M2 is coupled to the low voltage signal terminal VSS, and a second electrode of the second transistor M2 is coupled to the pull-up node PU. The second reset sub-circuit 32 includes a fourth transistor M4, a gate electrode of the fourth transistor M4 is coupled to the reset signal terminal RESET, a first electrode of the fourth transistor M4 is coupled to the low voltage signal terminal VSS, and a second electrode of the fourth transistor M4 is coupled to the output signal terminal OUT.

The noise reduction circuit 4 includes a first modulation sub-circuit 41, a first suppression sub-circuit 42, and a first noise reduction sub-circuit 43.

The first modulation sub-circuit 41 is coupled to the first modulation voltage signal terminal VDDA and the first pull-down node PD1, and configured to provide a signal of the first modulation voltage signal terminal VDDA to the first pull-down node PD1 to generate a first pull-down node signal (i.e., a noise reduction node signal) for driving the first noise reduction sub-circuit 43. The first modulation sub-circuit 41 includes a fifth transistor M5 having a gate electrode and a first electrode coupled to the first modulation voltage signal terminal VDDA and a second electrode coupled to the first pull-down node PD1.

The first suppression sub-circuit 42 is coupled to the pull-up node PU, the first pull-down node PD1, and the low voltage signal terminal VSS, and configured to provide the signal of the low voltage signal terminal VSS to the first pull-down node PD1 under the control of the pull-up node PU, thereby temporarily disabling the first modulation sub-circuit 41 when the gate shift signal is output. The first suppression sub-circuit 42 includes a seventh transistor M7 having a gate electrode coupled to the pull-up node PU, a first electrode coupled to the low voltage signal terminal VSS, and a second electrode coupled to the first pull-down node PD1.

The first noise reduction sub-circuit 43 is coupled to the first pull-down node PD1, the pull-up node PU, the low voltage signal terminal VSS, and the output signal terminal OUT, and configured to provide a signal of the low voltage signal terminal VSS to the output signal terminal OUT and the pull-up node PU under the control of the first pull-down node PD1, thereby continuously pulling down the output signal terminal and the pull-up node after the outputting of the gate shift signal is completed. The first noise reduction sub-circuit 43 includes a sixteenth transistor M16 and a tenth transistor M10. The sixteenth transistor M16 has a gate electrode coupled to the first pull-down node PD1, a first electrode coupled to the low voltage signal terminal VSS, and a second electrode coupled to the output signal terminal OUT. The tenth transistor M10 has a gate electrode coupled to the first pull-down node PD1, a first electrode coupled to the low voltage signal terminal VSS, and a second electrode coupled to the pull-up node PU.

The first pull-down node control circuit 5 includes an eleventh transistor M11 and a second capacitor C2, and the eleventh transistor M11 serves as a voltage dividing transistor. A gate electrode and a second electrode of the eleventh transistor M11 are coupled to the first pull-down node PD1, and a first electrode of the eleventh transistor M11 is coupled to the low voltage signal terminal VSS. The second capacitor C2 has a first end coupled to the first pull-down node PD1 and a second end coupled to the reset signal terminal RESET. A reset signal of the reset signal terminal RESET is an output signal of the shift register in a next stage, that is, the second end of the second capacitor C2 is coupled to an output signal terminal of the shift register in the next stage. When the shift register in the next stage outputs a high level, the first pull-down node (i.e., the noise reduction node) PD1 is pulled up (e.g., pulled up to the second level), so that the noise reduction capability of the first noise reduction sub-circuit is improved. When the outputting of the shift signal in the next stage is completed, the voltage level of the first pull-down node is lowered, and the first pull-down node PD1 is maintained to a lower voltage level (e.g., a third level) in a phase after the pulling up of the first pull-down node PD1 is completed.

Figure 3:
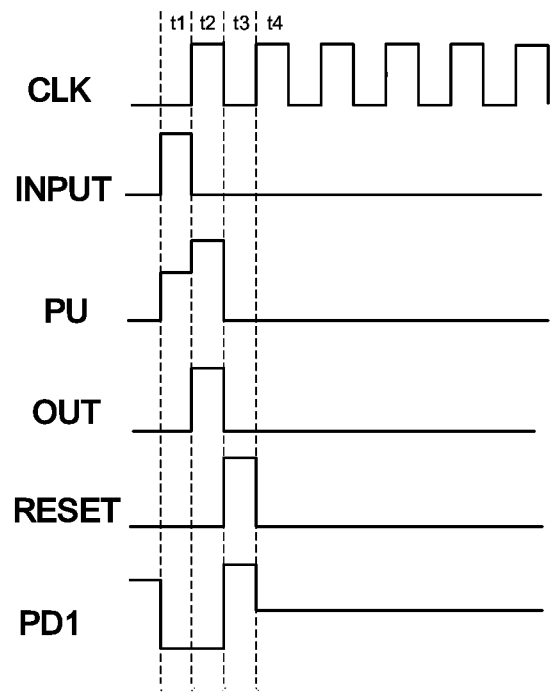
FIG. 3 is an operation timing diagram of a shift register according to an embodiment of the present disclosure.

The timing diagram of the shift register in this embodiment is shown in FIG. 3. The operation process of the shift register includes four phases, namely, a pull-up phase, an output phase, a noise reduction initial phase and a noise reduction maintaining phase, and the operation principle is explained in detail as follows.

In the first phase t1, i.e., the pull-up phase, the input signal of the input signal terminal INPUT is active, the input signal is output to the pull-up node PU, and the signal level of the pull-up node PU rises. At this time, the input signal is active (at a high level), the first transistor M1 is turned on, the input signal is output to the pull-up node PU, the signal level of the pull-up node PU rises, and the signal of the pull-up node PU is pulled up for the first time.

In the second phase t2, i.e., the output phase, the clock signal of the clock signal terminal CLK is active, and the output signal terminal OUT outputs the shift signal (i.e., a high level pulse is output through the output signal terminal in this phase). At this time, the clock signal is active (at a high level), the signal of the pull-up node PU is pulled up for the second time due to the bootstrap of the first capacitor C1, the third transistor M3 is turned on, and a high-level shift signal is output through the output signal terminal OUT. In this phase, the voltage level of the pull-up node PU is higher than the voltage level of the pull-up node PU pulled up for the first time in the first phase. At this time, the signal of the low level voltage terminal VSS is provided to the first pull-down node PD1 via the seventh transistor M7, so that the first pull-down node PD1 is pulled down to the first level.

In the third phase t3, i.e., the reset phase, also called the noise reduction initial phase, the reset signal of the reset signal terminal RESET is active, the pull-up node PU and the output signal terminal OUT are reset through the reset signal, and the signal of the first pull-down node PD1 is pulled up through the reset signal. At this time, after the outputting of the shift signal from the output signal terminal OUT(n) in the current stage is completed, the shift signal of the output signal terminal OUT(n+1) of the shift register in the next stage, which is the reset signal of the reset signal terminal RESET in the current stage, is active (at a high level or on level), the second transistor M2 and the fourth transistor M4 are respectively turned on, the pull-up node PU and the output signal terminal OUT are reset through the reset signal, so the pull-up node PU and the output signal terminal OUT are at a low level, and the outputting of the shift signal is stopped. Meanwhile, the first pull-down node PD1 is pulled up by the signal of the reset signal terminal RESET due to the bootstrap of the second capacitor C2. At this time, the voltage level of the first pull-down node PD1 is pulled up to a second level, which is higher than or equal to the on level of the signal of the reset signal terminal RESET.

In the fourth phase t4, i.e., the noise reduction maintaining phase, the voltage of the first pull-down node PD1 is lowered to the third level, and noise reduction is continuously performed on the output signal terminal OUT and the pull-up node PU. The third level is between the first level and the on level. To avoid possible noise of the pull-up node PU, the first noise reduction sub-circuit 43 is required to be turned on through the first pull-down node PD1 to pull down the pull-up node PU continuously, and therefore, the signal of the first pull-down node PD1 is active. In other words, although the third level is lower than an on level in the general sense (e.g., the on level of the reset signal terminal RESET), it is still capable of enabling the first noise reduction sub-circuit 43 (e.g., turning on the tenth transistor M10 and the fourth transistor M4), thereby continuously pulling down the pull-up node PU and the output signal terminal OUT.

At this time, the first transistor M1 is turned off, the third transistor M3 is turned off, a signal of the first modulation voltage terminal VDDA is provided to the first pull-down node PD1 through the turned-on fifth transistor M5 to pull up the first pull-down node PD1, and the tenth transistor M10 and the sixteenth transistor M16 are turned on, respectively. Since the output of the output signal terminal OUT (n+1) of the shift register in the next stage can only be maintained for one clock cycle, after the outputting of the output signal terminal OUT(n+1) of the shift register in the next stage is completed, the outputting of the reset signal terminal RESET is stopped (i.e., at this time, a low level is provided through the reset signal terminal RESET), and the second transistor M2 and the fourth transistor M4 are turned off. Since the pull-up node PU is at a low level, the seventh transistor M7 is turned off, the voltage between two ends of the second capacitor C2 decreases, and the first pull-down node PD1 is no longer affected by the bootstrap effect of the second capacitor C2. Due to the combined action of the fifth transistor M5 and the eleventh transistor M11, the first pull-down node PD1 is at the third level lower than a normal on level (i.e., a high level of the signal VDDA). At this time, the voltage of the first pull-down node signal PD1 decreases, but the normal operation of the first noise reduction sub-circuit is still maintained, so that noise reduction is continuously performed on the output signal terminal OUT and the pull-up node PU.

In the shift register, the signal of the pull-down node is of a high voltage at the noise reduction initial phase, which is beneficial to noise reduction of the output signal terminal and the pull-up node, and is of a low voltage at the phase after the noise reduction initial phase, which is beneficial to improving the threshold drift of the transistor.

The embodiment of the present disclosure provides a shift register and a corresponding driving method thereof, which can effectively avoid threshold value drift of a thin film transistor in the shift register and provide better noise reduction effect.

Figure 2:
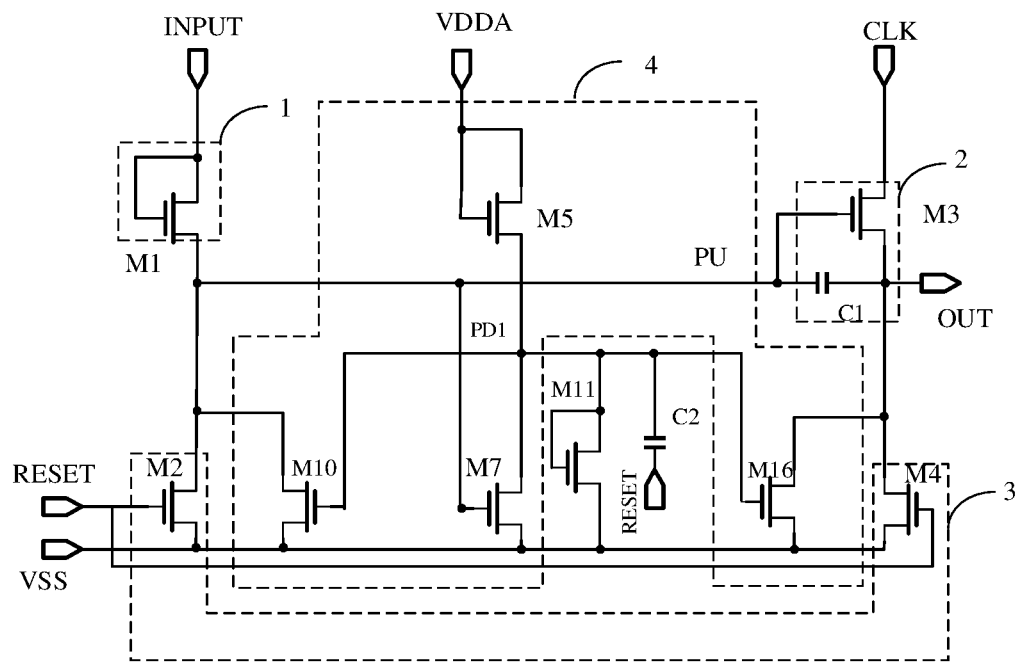
FIG. 2 is a schematic circuit diagram of a shift register according to an embodiment of the present disclosure.

The shift register of the present embodiment differs from the shift register shown in FIG. 1 and FIG. 2 in that, the noise reduction circuit in the shift register of the present embodiment includes a first noise reduction circuit and a second noise reduction circuit having the same structure, having the same function, operating alternately, so that the high level time of the transistor (e.g., M9/M17 or M16/M10 shown in FIG. 5) in the noise reduction circuit can be reduced to half of the original time, thereby further preventing serious drift due to a high level signal being applied to the gate electrode of the transistor for a long time.

Figure 4:
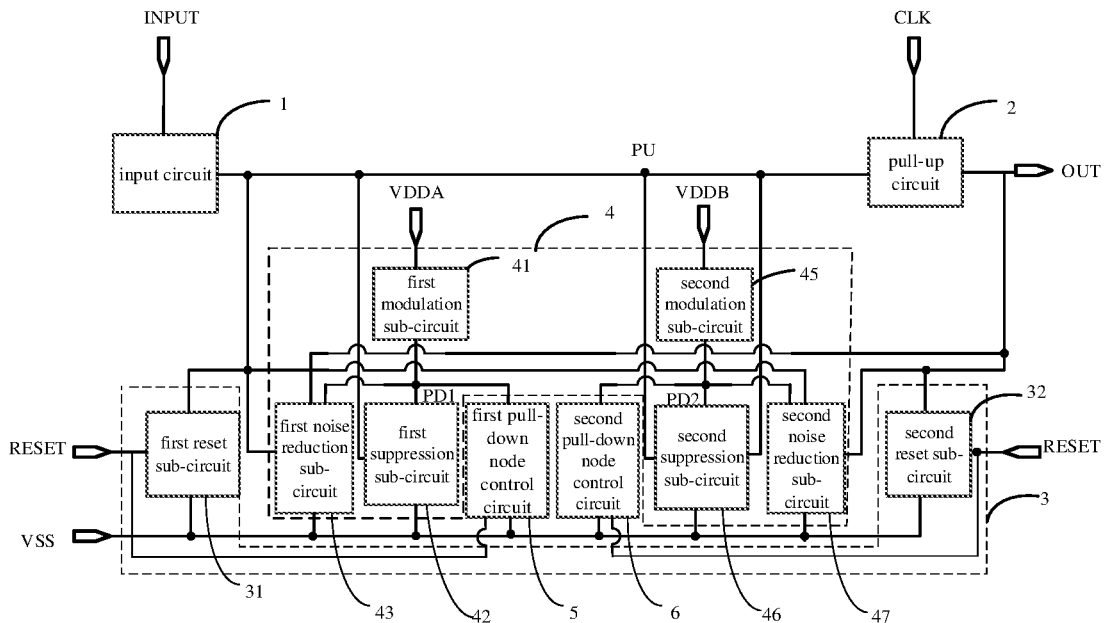
FIG. 4 is a block diagram of a shift register in an embodiment of the present disclosure.

As shown in FIG. 4, the shift register includes an input circuit 1, a pull-up circuit 2, a reset circuit 3, a noise reduction circuit 4, a first pull-down node control circuit 5, and a second pull-down node control circuit 6.

The input circuit 1 is coupled to the input signal terminal INPUT and the pull-up node PU, and configured to provide a signal of the input signal terminal INPUT to the pull-up node PU, that is, to charge the pull-up node under the control of the input signal, thereby pulling up the pull-up node.

The pull-up circuit 2 is coupled to the clock signal terminal CLK, the output signal terminal OUT, and the pull-up node PU, and configured to provide a signal of the clock signal terminal CLK to the output signal terminal OUT under the control of the pull-up node PU, thereby outputting a shift signal and pulling up the pull-up node signal for a second time.

The reset circuit 3 is coupled to the reset signal terminal RESET, the output signal terminal OUT, the pull-up node PU, and the low voltage signal terminal VSS, and configured to provide the signal of the low voltage signal terminal VSS to the output signal terminal OUT and the pull-up node PU under the control of a signal of the reset signal terminal RESET, thereby resetting the output signal terminal OUT and the pull-up node PU to a low level. The signal of the low voltage signal terminal VSS has a constant first level (e.g., a low level or an off level).

The noise reduction circuit 4 is coupled to the modulation voltage signal terminal VDDA, the low voltage signal terminal VSS, the output signal terminal OUT, the pull-up node PU, and the first pull-down node PD1, and configured to control the first pull-down node PD1 according to a signal of the modulation voltage signal terminal VDDA and a signal of the pull-up node PU, and provide a signal of the low voltage signal terminal VSS to the output signal terminal OUT and the pull-up node PU under the control of the first pull-down node PD1, thereby continuously setting the output signal terminal OUT and the pull-up node PU to a low level after the reset operation.

The first pull-down node control circuit 5 is coupled to the first pull-down node PD1, the low voltage signal terminal VSS, and the reset signal terminal RESET, and is configured to control the voltage level of the first pull-down node PD1 according to the signal of the reset signal terminal RESET. The first pull-down node control circuit 5 controls the voltage level of the first pull-down node PD1 to a second level higher than or equal to the on level when the signal of the reset signal terminal RESET has the on level, and controls the voltage level of the first pull-down node PD1 to a third level between the on level and the first level when the signal of the reset signal terminal RESET transitions from the on level to the off level.

The second pull-down node control circuit 6 is coupled to the second pull-down node PD2, the low voltage signal terminal VSS, and the reset signal terminal RESET, and configured to control the voltage level of the second pull-down node PD2 according to the signal of the reset signal terminal RESET. The second pull-down node control circuit 6 controls the voltage level of the second pull-down node PD2 to a second level higher than or equal to the on level when the signal of the reset signal terminal RESET has the on level, and controls the voltage level of the second pull-down node PD2 to the third level between the on level and the first level when the signal of the reset signal terminal RESET transitions from the on level to the off level.

Figure 5:
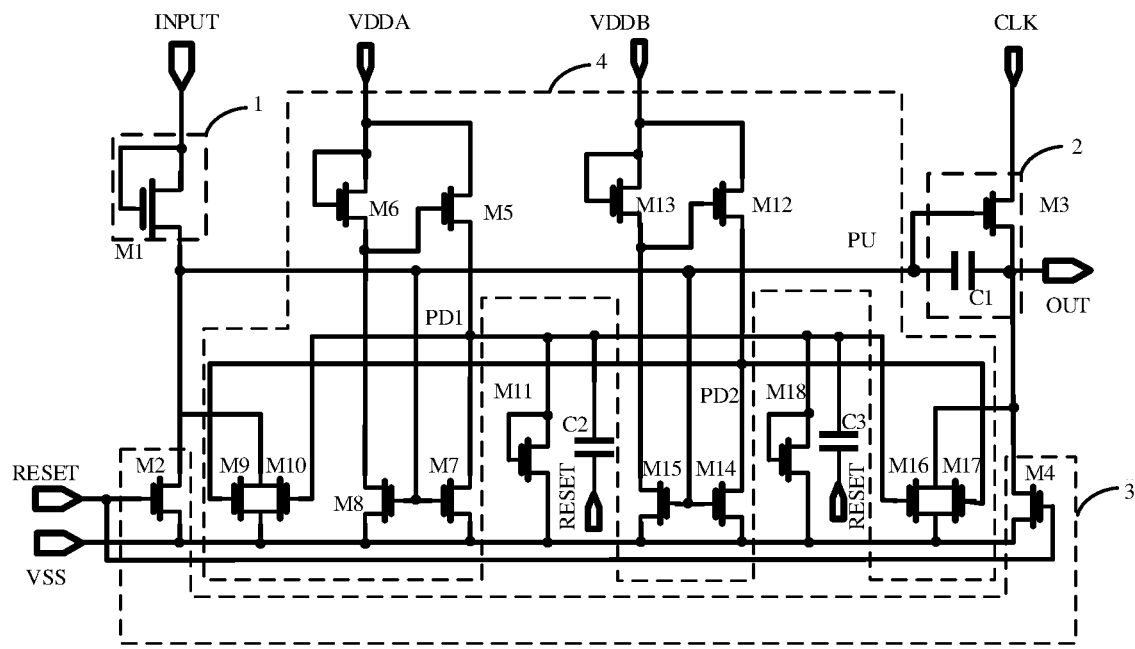
FIG. 5 is a schematic circuit diagram of a shift register according to an embodiment of the present disclosure.

Hereinafter, each circuit in FIG. 4 will be described in detail with reference to the schematic circuit diagram of FIG. 5.

The input circuit 1 includes a first transistor M1 having a gate electrode and a first electrode coupled to the input signal terminal INPUT, and a second electrode coupled to the pull-up node PU.

The pull-up circuit 2 includes a third transistor M3 and a first capacitor C1. The third transistor M3 has a gate electrode coupled to the pull-up node PU, a first electrode coupled to the clock signal terminal CLK, and a second electrode coupled to the output signal terminal OUT. The first capacitor C1 has a first end coupled to the pull-up node PU, and a second end coupled to the output signal terminal OUT.

The reset circuit 3 includes a first reset sub-circuit 31 and a second reset sub-circuit 32. The first reset sub-circuit 31 is coupled to the reset signal terminal RESET, the pull-up node PU, and the low voltage signal terminal VSS, and configured to reset the pull-up node PU under the control of a reset signal of the reset signal terminal RESET. The second reset sub-circuit 32 is coupled to the reset signal terminal RESET, the output signal terminal PU, and the low voltage signal terminal VSS, and configured to reset the output signal terminal OUT under the control of the reset signal of the reset signal terminal RESET.

The first reset sub-circuit 31 includes a second transistor M2, a gate electrode of the second transistor M2 is coupled to the reset signal terminal RESET, a first electrode of the second transistor M2 is coupled to the low voltage signal terminal VSS, and a second electrode of the second transistor M2 is coupled to the pull-up node PU. The second reset sub-circuit 32 includes a fourth transistor M4, a gate electrode of the fourth transistor M4 is coupled to the reset signal terminal RESET, a first electrode of the fourth transistor M4 is coupled to the low voltage signal terminal VSS, and a second electrode of the fourth transistor M4 is coupled to the output signal terminal OUT.

The noise reduction circuit 4 includes a first noise reduction circuit and a second noise reduction circuit which have the same structure, have the same function, and operate alternately with a period of about 2 seconds.

The first noise reduction circuit includes a first modulation sub-circuit 41, a first suppression sub-circuit 42, and a first noise reduction sub-circuit 43.

The first modulation sub-circuit 41 is coupled to the first modulation voltage signal terminal VDDA and the first pull-down node PD1, and configured to provide a signal of the first modulation voltage signal terminal VDDA to the first pull-down node PD1 to generate a first pull-down node signal (i.e., a noise reduction node signal) for driving the first noise reduction sub-circuit 43. The first modulation sub-circuit 41 includes a fifth transistor M5 and a sixth transistor M6. The fifth transistor M5 has a gate electrode coupled to a second electrode of the sixth transistor M6, a first electrode coupled to the first modulation voltage signal terminal VDDA, and a second electrode coupled to the first pull-down node PD1. The sixth transistor M6 has a gate electrode and a first electrode coupled to the first modulation voltage signal terminal VDDA, and a second electrode coupled to the first pull-down node PD1.

The first suppression sub-circuit 42 is coupled to the pull-up node PU, the first pull-down node PD1, and the low voltage signal terminal VSS, and configured to provide a signal of the low voltage signal terminal VSS to the first pull-down node PD1 under the control of the pull-up node PU, thereby temporarily disabling the first modulation sub-circuit 41 when the shift signal is output. The first suppression sub-circuit 42 includes a seventh transistor M7 and an eighth transistor M8. The seventh transistor M7 has a gate electrode coupled to the pull-up node PU, a first electrode coupled to the low voltage signal terminal VSS, and a second electrode coupled to the first pull-down node PD1. The eighth transistor M8 has a gate electrode coupled to the pull-up node PU, a first electrode coupled to the low voltage signal terminal VSS, and a second electrode coupled to the second electrode of the sixth transistor M6.

The first noise reduction sub-circuit 43 is coupled to the first pull-down node PD1, the pull-up node PU, the low voltage signal terminal VSS, and the output signal terminal OUT, and configured to provide a signal of the low voltage signal terminal VSS to the output signal terminal OUT and the pull-up node PU under the control of the first pull-down node PD1, thereby continuously pulling down the output signal terminal and the pull-up node after the outputting of the shift signal is completed. The first noise reduction sub-circuit 43 includes a sixteenth transistor M16 and a tenth transistor M10. The sixteenth transistor M16 has a gate electrode coupled to the first pull-down node PD1, a first electrode coupled to the low voltage signal terminal VSS, and a second electrode coupled to the output signal terminal OUT. The tenth transistor M10 has a gate electrode coupled to the first pull-down node PD1, a first electrode coupled to the low voltage signal terminal VSS, and a second electrode coupled to the pull-up node PU.

The first pull-down node control circuit 5 includes an eleventh transistor M11 and a second capacitor C2, and the eleventh transistor M11 serves as a voltage dividing transistor. A gate electrode and a second electrode of the eleventh transistor M11 are coupled to the first pull-down node PD1, and a first electrode of the eleventh transistor M11 is coupled to the low voltage signal terminal VSS. The second capacitor C2 has a first end coupled to the first pull-down node PD1 and a second end coupled to the reset signal terminal RESET. A reset signal of the reset signal terminal RESET is an output signal of the shift register in a next stage, that is, the second end of the second capacitor C2 is coupled to an output signal terminal of the shift register in the next stage. When the shift register in the next stage outputs a high level, the first pull-down node (i.e., the noise reduction node) PD1 is pulled up (e.g., pulled up to the second level), so that the noise reduction capability of the first noise reduction sub-circuit is improved. When the outputting of the shift signal in the next stage is completed, the voltage level of the first pull-down node is lowered, and the first pull-down node PD1 is maintained to a lower voltage level (e.g., a third level) in a phase after the pulling up of the first pull-down node PD1 is completed.

The second noise reduction circuit includes a second modulation sub-circuit 45, a second suppression sub-circuit 46, and a second noise reduction sub-circuit 47.

The second modulation sub-circuit 45 is coupled to the second modulation voltage signal terminal VDDB and the second pull-down node PD2, and configured to provide a signal of the second modulation voltage signal terminal VDDB to the second pull-down node PD2 to generate a second pull-down node signal (i.e., a noise reduction node signal) for driving the second noise reduction sub-circuit 47. The second modulation sub-circuit 45 includes a twelfth transistor M12 and a thirteenth transistor M13. The twelfth transistor M12 has a gate electrode coupled to a second electrode of the thirteenth transistor M13, a first electrode coupled to the second modulation voltage signal terminal VDDB, and a second electrode coupled to the second pull-down node PD2. The thirteenth transistor M13 has a gate electrode and a first electrode coupled to the second modulation voltage signal terminal VDDB and a second electrode coupled to the gate electrode of the twelfth transistor.

The second suppression sub-circuit 46 is coupled to the pull-up node PU, the second pull-down node PD2, and the low voltage signal terminal VSS, and configured to provide the signal of the low voltage signal terminal VSS to the second pull-down node PD2 under the control of the pull-up node PU, thereby disabling the second modulation sub-circuit 45 when the shift signal is output. The second suppression sub-circuit 46 includes a fourteenth transistor M14 and a fifteenth transistor M15. The fourteenth transistor M14 has a gate electrode coupled to the pull-up node PU, a first electrode coupled to the low voltage signal terminal VSS, and a second electrode coupled to the second pull-down node PD2. The fifteenth transistor M15 has a gate electrode coupled to the pull-up node PU, a first electrode coupled to the low voltage signal terminal VSS, and a second electrode coupled to the second electrode of the thirteenth transistor M13.

The second noise reduction sub-circuit 47 is coupled to the pull-up node PU, the second pull-down node PD2, the low voltage signal terminal VSS, and the output signal terminal OUT, and configured to provide the signal of the low voltage signal terminal VSS to the output signal terminal OUT and the pull-up node PU under the control of the second pull-down node PD2, thereby continuously pulling down the output signal and the pull-up node signal after the outputting of the shift signal is completed. The second noise reduction sub-circuit 47 includes a ninth transistor M9 and a seventeenth transistor M17. The ninth transistor M9 has a gate electrode coupled to the second pull-down node PD2, a first electrode coupled to the low voltage signal terminal VSS, and a second electrode coupled to the pull-up node PU. The seventeenth transistor M17 has a gate electrode coupled to the second pull-down node PD2, a first electrode coupled to the low voltage signal terminal VSS, and a second electrode coupled to the output signal terminal OUT.

The second pull-down node control circuit 6 includes an eighteenth transistor M18 and a third capacitor C3. A gate electrode and a second electrode of the eighteenth transistor M18 are coupled to the second pull-down node PD2, and a first electrode of the eighteenth transistor M18 is coupled to the low voltage signal terminal. The third capacitor C3 has a first end coupled to the second pull-down node PD2 and a second end coupled to the reset signal terminal RESET. The second end of the third capacitor C3 is coupled to the output signal terminal of the shift register in a next stage. When a high-level signal is output through the shift register in the next stage, the second pull-down node (i.e., noise reduction node) PD2 is pulled up (e.g., pulled up to a second level), so as to improve the noise reduction capability of the second noise reduction sub-circuit. When the outputting of the shift signal of the next stage is completed, the voltage level of the second pull-down node PD2 is lowered accordingly, and maintains at a lower voltage level (e.g., a third level).

The voltage signal of the first noise reduction circuit is provided by a first modulation voltage signal VDDA, and the voltage signal of the second noise reduction circuit is provided by a second modulation voltage signal VDDB. The first and second modulation voltage signals VDDA and VDDB are signals having a long period (a duration of which is 2 s), and the waveform of the signal VDDA is inverse to that of the signal VDDB. The signal of the first pull-down node PD1 is generated by transforming the signal VDDA through the transistors M5 and M6, and the signal of the second pull-down node PD2 is generated by transforming the signal VDDB through the transistors M12 and M13. The second pull-down node PD2 is at a low level when the first pull-down node PD1 is at a high level. With the two noise reduction circuits, the drift of the threshold voltage Vth of the transistors (e.g., M9, M10 and M16, M17 in FIG. 5) in the shift register can be reduced.

To improve threshold drift of transistors in the noise reduction circuit, the eleventh transistor M11 is disposed between the first pull-down node PD1 and the low voltage signal terminal VSS, the second capacitor C2 is disposed between the first pull-down node PD1 and the reset signal terminal RESET, the eighteenth transistor M18 is disposed between the second pull-down node PD2 and the low voltage signal terminal VSS, and the third capacitor C3 is disposed between the second pull-down node PD2 and the reset signal terminal RESET.

In some embodiments, the transistors in the shift register are thin film transistors. In some embodiments, all transistors in the shift register are N-type transistors. In some embodiments, all transistors in the shift register are P-type transistors. In some embodiments, some of the transistors in the shift register are P-type transistors and the other thereof are N-type transistors. In the shift register according to this embodiment, all transistors are described by taking N-type transistors as an example, and it is conceivable that in a case where the transistors in the shift register are P-type transistors instead of N-type transistors, the polarity of signals needs to be inverted, and the connection manner remains unchanged, which will not be described in detail here.

In the shift register in this embodiment, during the noise reduction initial phase, the pull-down node control circuit is used as an additional circuit for boosting, and during the noise reduction maintaining phase, the pull-down node control circuit is used for maintaining a low voltage. The shift register can reduce the drift of threshold voltage Vth of a transistor in the noise reduction circuit, so that the size of the noise reduction circuit of the shift register can be reduced properly, which facilitates realization of narrow bezel of a display product without increasing the fabrication processes and the production cost.

The timing diagram of the shift register in this embodiment may still refer to FIG. 3. The operation process of the shift register includes four phases, namely, a pull-up phase, an output phase, a noise reduction initial phase and a noise reduction maintaining phase, and the operation principle is explained in detail as follows.

Figure 6A:
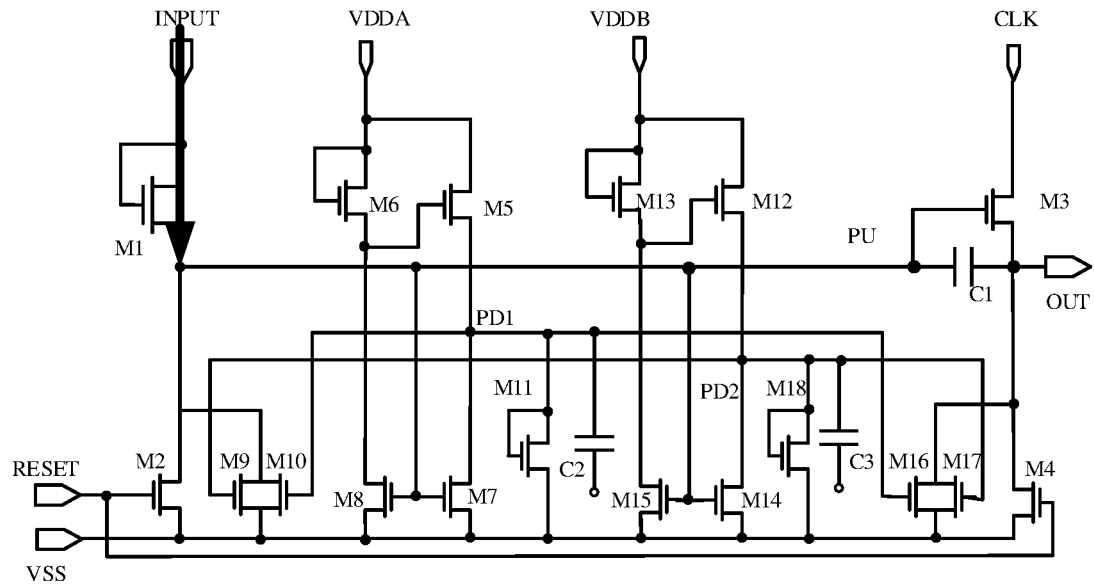
FIGS. 6A to 6D are circuit diagrams illustrating the operation principle of the shift register in different stages in an embodiment of the present disclosure.

In the first phase t1, i.e., the pull-up phase, the input signal of the input signal terminal INPUT is active, the input signal is output to the pull-up node PU, and the signal level of the pull-up node PU rises. As shown in FIG. 6A, the input signal is active (at a high level), the first transistor M1 is turned on, the input signal INPUT is output to the pull-up node PU, the signal level of the pull-up node PU rises, and at this time, the signal of the pull-up node PU is pulled up for the first time.

Figure 6B:
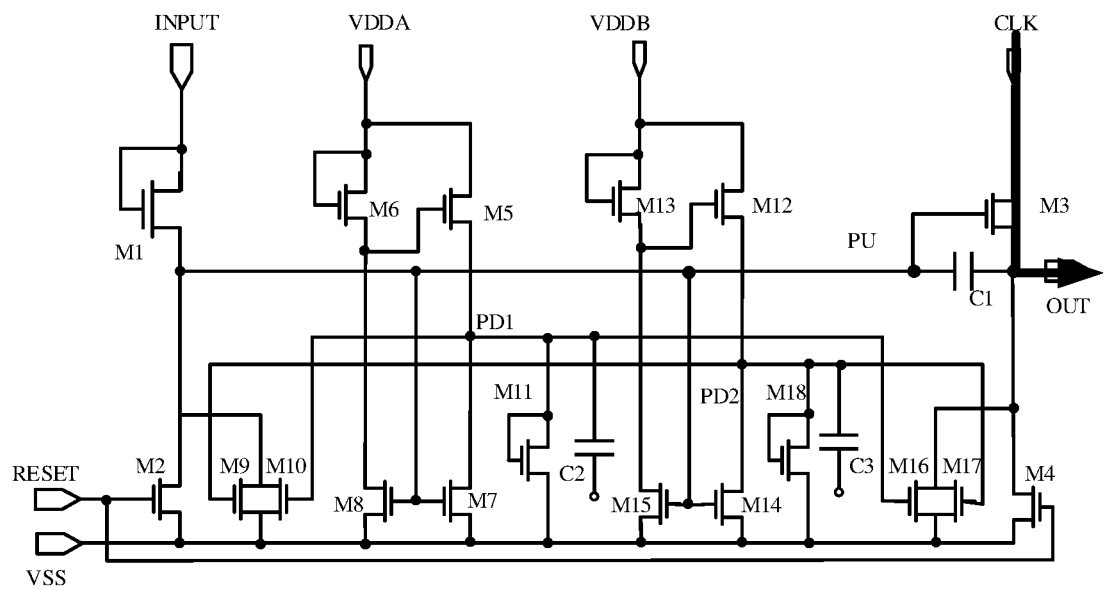

In the second phase t2, i.e., the output phase, the clock signal of the clock signal terminal CLK is active, and the output signal terminal OUT outputs the shift signal (i.e., a high level pulse is output through the output signal terminal in this phase). As shown in FIG. 6B, the clock signal is active (at a high level), the signal of the pull-up node PU is pulled up for the second time due to the bootstrap of the first capacitor C1, the third transistor M3 is turned on, and a high-level shift signal is output through the output signal terminal OUT. In this phase, the voltage level of the pull-up node PU is higher than the voltage level of the pull-up node PU pulled up for the first time in the first phase. At this time, the signal of the low level voltage terminal VSS is provided to the first pull-down node PD1 via the seventh transistor M7 and provided to the second pull-down node PD2 via the fourteenth transistor M14, so that the first and second pull-down nodes PD1 and PD2 are pulled down to the first level.

Figure 6C:
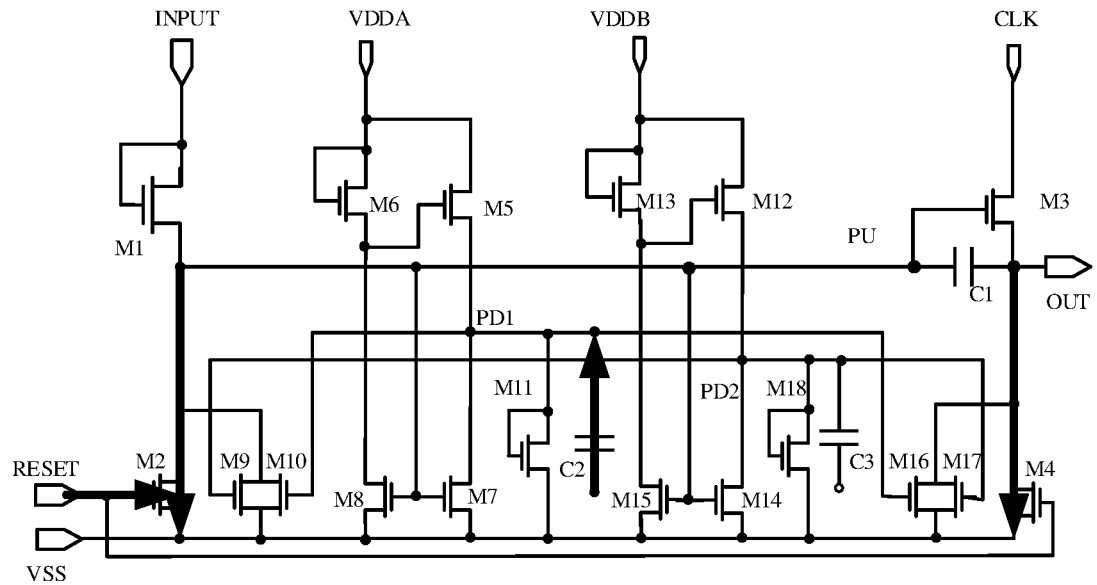

In the third phase t3, i.e., the reset phase, also called the noise reduction initial phase, the reset signal of the reset signal terminal RESET is active, the pull-up node PU and the output signal terminal OUT are reset through the reset signal, and meanwhile, the signal of the first pull-down node PD1 or the second pull-down node PD2 is pulled up through the reset signal. As shown in FIG. 6C, after the outputting of the shift signal from the output signal terminal OUT(n) in the current stage is completed, the shift signal of the output signal terminal OUT(n+1) of the shift register in the next stage, which is the reset signal of the reset signal terminal RESET in the current stage, is active (at a high level or on level), the second transistor M2 and the fourth transistor M4 are respectively turned on, the pull-up node PU and the output signal terminal OUT are reset through the reset signal, so the pull-up node PU and the output signal terminal OUT are at a low level, and the outputting of the shift signal is stopped. Meanwhile, the first pull-down node PD1 or the second pull-down node PD2 is pulled up by the signal of the reset signal terminal RESET due to the bootstrap of the second capacitor C2 or the third capacitor C3. At this time, the voltage level of the first pull-down node PD1 is pulled up to a second level, which is higher than or equal to the on level of the signal of the reset signal terminal RESET.

Figure 6D:
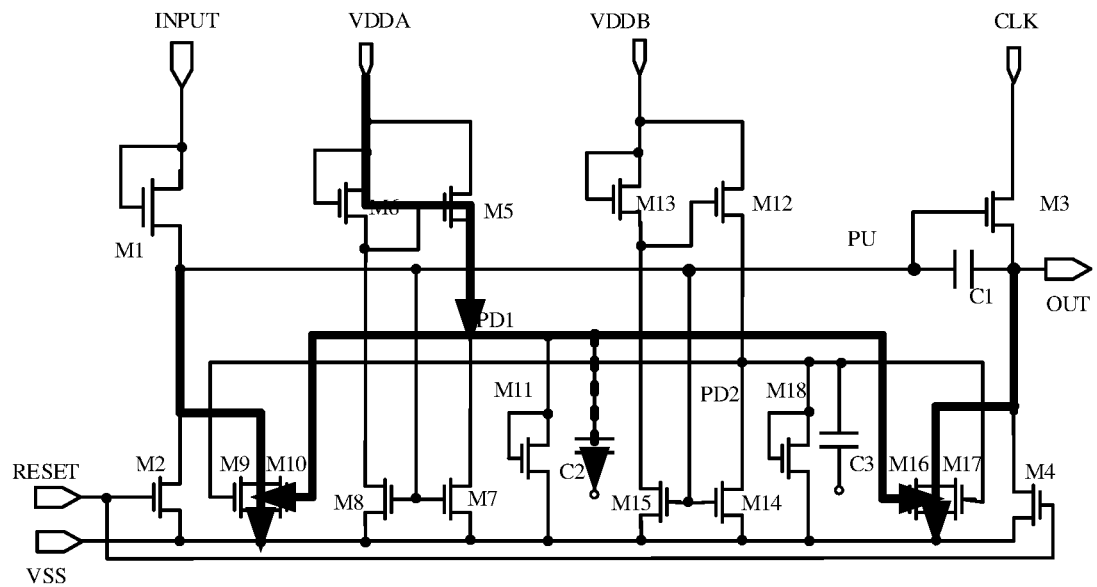

In the fourth phase t4, i.e., the noise reduction maintaining phase, the voltage of the first pull-down node PD1 or the second pull-down node PD2 is lowered to the third level, and noise reduction is continuously performed on the output signal terminal OUT and the pull-up node PU. The third level is between the first level and the on level. As shown in FIG. 6D, to avoid possible noise of the pull-up node PU, the noise reduction sub-circuit is required to be turned on through the first pull-down node PD1 or the second pull-down node PD2 to pull down the pull-up node PU continuously, and therefore, the signal of the first pull-down node PD1 or the second pull-down node PD2 is active (at any time point, the signal of only one pull-down node is at a high level). Taking the operation of the first noise reduction circuit as an example, the first transistor M1 is turned off, the third transistor M3 is turned off, a signal of the first modulation voltage terminal VDDA is provided to the first pull-down node PD1 through the turned-on fifth and sixth transistors M5 and M6 to pull up the first pull-down node PD1, and the tenth transistor M10 and the sixteenth transistor M16 are turned on, respectively. Since the output of the output signal terminal OUT(n+1) of the shift register in the next stage can only be maintained for one clock cycle, after the outputting of the output signal terminal OUT(n+1) of the shift register in the next stage is completed, the outputting of the reset signal terminal RESET is stopped (i.e., at this time, a low level is provided through the reset signal terminal RESET), and the second transistor M2 and the fourth transistor M4 are turned off. Since the pull-up node PU is at a low level, the seventh transistor M7 is turned off, the voltage between two ends of the second capacitor C2 decreases, and the first pull-down node PD1 is no longer affected by the bootstrap effect of the second capacitor C2. Due to the combined action of the fifth transistor M5 and the eleventh transistor M11, the first pull-down node PD1 is at the third level lower than a normal on level (i.e., a high level of the signal VDDA), and the noise of the pull-up node PU and the output signal terminal OUT is continuously released. Similarly, the ninth transistor M9 and the seventeenth transistor M17 are turned on, respectively. Since the output of the output signal terminal OUT(n+1) of the shift register in the next stage can only be maintained for one clock cycle, after the outputting of the output signal terminal OUT(n+1) of the shift register in the next stage is completed, the outputting of the reset signal terminal RESET is stopped (i.e., at this time, a low level is provided through the reset signal terminal RESET), and the second pull-down node PD2 is no longer affected by the bootstrap effect of the third capacitor C3. Due to the combined action of the twelfth transistor M12 and the eighteenth transistor M18, the second pull-down node PD2 is at the third level lower than a normal on level (i.e., a high level of the signal VDDB). At this time, the voltage of the first pull-down node signal PD1 or the second pull-down node signal PD2 is reduced, but the normal operation of the noise reduction sub-circuit is still maintained, and noise reduction is continuously performed on the output signal terminal OUT and the pull-up node PU.

In the above shift register, the signal of the pull-down node has a higher voltage in the noise reduction initial phase, which is beneficial to noise reduction of the output signal terminal and the pull-up node. The fifth transistor M5 and the eleventh transistor M11 each correspond to a resistor with unidirectional conduction, and a voltage drop occurs across the resistor. After the third phase completes, the voltage of the first pull-down node PD1 is relatively decreased due to the combined action of the fifth transistor M5 and the eleventh transistor M11. Similarly, due to the combined action of the twelfth transistor M12 and the eighteenth transistor M18, the voltage of the second pull-down node PD2 relatively drops. Since the voltages of the first and second pull-down nodes PD1 and PD2 after the fourth phase are relatively low, the gate bias voltages of the ninth, tenth, sixteenth, and seventeenth transistors M9, M10, M16, and M17 are relatively low, and the drift degree of the threshold voltage Vth is reduced.

In general, the noise reduction circuit mainly functions in an initial phase of one frame, so that a higher voltage is not required in the subsequent stage, and the shift register of the embodiment can completely meet the noise reduction requirement.

The shift register is particularly suitable for a gate driving circuit of a large-size liquid crystal display device.

The embodiments of the present disclosure provide a gate driving circuit, which includes the above shift register.

Figure 7:
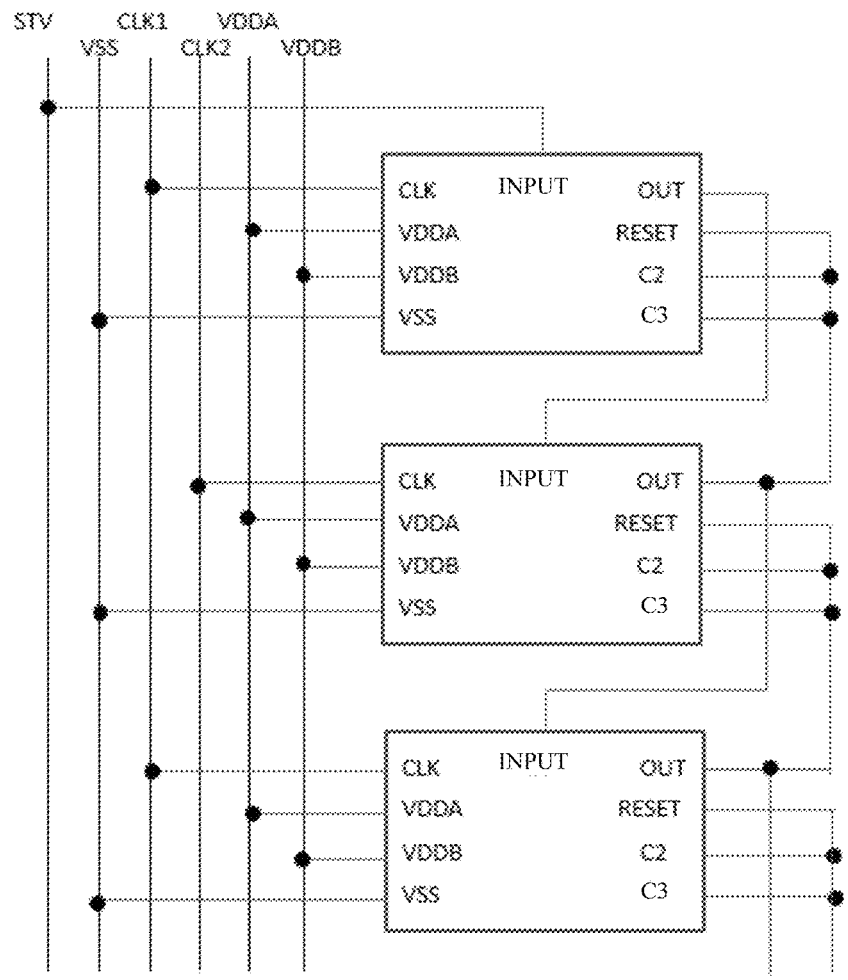
FIG. 7 is a schematic diagram of a gate driving circuit according to an embodiment of the present disclosure.

In the gate driving circuit, a plurality of shift registers are coupled in cascade, and as shown in FIG. 7, an output signal terminal of a shift register in a previous stage is coupled to an input signal terminal of a shift register in a current stage, and an output signal terminal of a shift register in a next stage is coupled to a reset signal terminal of the shift register in the current stage.

That is, in the shift register in the gate driving circuit, the input signal INPUT of a certain stage is the output signal OUT of the previous stage, and the reset signal RESET of the certain stage is the output signal OUT of the next stage.

The embodiments of the present disclosure provide a display device including the above gate driving circuit.

The display device may be any product or component with a display function, such as a desktop computer, a tablet computer, a laptop computer, a mobile phone, a PDA, a GPS, an on-board display, a projection display, a video camera, a digital camera, an electronic watch, a calculator, an electronic instrument, a gauge, a liquid crystal panel, an electronic paper, a television, a monitor, a digital photo frame, a navigator, or the like, and may be applied to multiple fields such as public displays and virtual displays.

It can be understood that the foregoing embodiments are merely exemplary embodiments used for describing the principle of the present disclosure, but the present disclosure is not limited thereto. Those of ordinary skill in the art may make various variations and improvements without departing from the spirit and essence of the present invention, and these variations and improvements shall also fall into the protection scope of the present disclosure.

What is claimed is:

1. A shift register, comprising:
   an input circuit coupled to an input signal terminal and a pull-up node, and configured to provide a signal of the input signal terminal to the pull-up node;
   a pull-up circuit coupled to a clock signal terminal, an output signal terminal, and the pull-up node, and configured to provide a signal of the clock signal terminal to the output signal terminal under control of the pull-up node;
   a reset circuit coupled to a reset signal terminal, the pull-up node, the output signal terminal, and a low voltage signal terminal, and configured to provide a signal of the low voltage signal terminal to the output signal terminal and the pull-up node under control of a signal of the reset signal terminal, the signal of the low voltage signal terminal having a constant first level;
   at least one noise reduction circuit coupled to a modulation voltage signal terminal, the low voltage signal terminal, the output signal terminal, the pull-up node, and at least one pull-down node, and configured to control the at least one pull-down node according to a signal of the modulation voltage signal terminal and a signal of the pull-up node, and provide the signal of the low voltage signal terminal to the output signal terminal and the pull-up node under control of the at least one pull-down node; and
   at least one pull-down node control circuit coupled to the at least one pull-down node, the low voltage signal terminal, and the reset signal terminal, and configured to control a voltage level of the at least one pull-down node according to the signal of the reset signal terminal,
   wherein the at least one pull-down node control circuit controls the voltage level of the at least one pull-down node to a second level higher than or equal to an on level in response to the signal of the reset signal terminal having the on level, and controls the voltage level of the at least one pull-down node to a third level between the on level and the first level in response to the signal of the reset signal terminal transitioning from the on level to an off level,
   wherein the at least one pull-down node comprises a first pull-down node,
   the at least one pull-down node control circuit comprises a first pull-down node control circuit coupled to the first pull-down node, the low voltage signal terminal, and the reset signal terminal, and configured to control a voltage level of the first pull-down node according to the signal of the reset signal terminal, and
   the at least one noise reduction circuit comprises a first noise reduction circuit, the first noise reduction circuit comprising:
      a first modulation sub-circuit coupled to a first modulation voltage signal terminal and the first pull-down node, and configured to provide a signal of the first modulation voltage signal terminal to the first pull-down node;
      a first suppression sub-circuit coupled to the pull-up node, the first pull-down node, and the low voltage signal terminal, and configured to provide the signal of the low voltage signal terminal to the first pull-down node under control of the pull-up node; and
      a first noise reduction sub-circuit coupled to the first pull-down node, the pull-up node, the low voltage signal terminal, and the output signal terminal and configured to provide the signal of the low voltage signal terminal to the output signal terminal and the pull-up node under control of the first pull-down node.

2. The shift register of claim 1, wherein the at least one noise reduction circuit provides the signal of the low voltage signal terminal to the output signal terminal and the pull-up node in response to the voltage level of the at least one pull-down node being at the third level.

3. The shift register of claim 2, wherein the first pull-down node control circuit comprises:
   an eleventh transistor having a gate electrode and a second electrode coupled to the first pull-down node, and a first electrode coupled to the low voltage signal terminal; and
   a second capacitor having a first end coupled to the first pull-down node, and a second end coupled to the reset signal terminal.

4. The shift register of claim 3, wherein the first modulation sub-circuit comprises a fifth transistor having a gate electrode and a first electrode coupled to the first modulation voltage signal terminal, and a second electrode coupled to the first pull-down node;
   the first suppression sub-circuit comprises a seventh transistor having a gate electrode coupled to the pull-up node, a first electrode coupled to the low voltage signal terminal, and a second electrode coupled to the first pull-down node,
   the first noise reduction sub-circuit comprises:
      a tenth transistor having a gate electrode coupled to the first pull-down node, a first electrode coupled to the low voltage signal terminal, and a second electrode coupled to the pull-up node; and
      a sixteenth transistor having a gate electrode coupled to the first pull-down node, a first electrode coupled to the low voltage signal terminal, and a second electrode coupled to the output signal terminal.

5. The shift register of claim 3, wherein the at least one pull-down node further comprises a second pull-down node,
   the at least one pull-down node control circuit further comprises a second pull-down node control circuit coupled to the second pull-down node, the low voltage signal terminal, and the reset signal terminal, and configured to control a voltage level of the second pull-down node according to the signal of the reset signal terminal, and the at least one noise reduction circuit further comprises a second noise reduction circuit, the second noise reduction circuit comprising:
- a second modulation sub-circuit coupled to a second modulation voltage signal terminal and the second pull-down node, and configured to provide a signal of the second modulation voltage signal terminal to the second pull-down node;
- a second suppression sub-circuit coupled to the pull-up node, the second pull-down node, and the low voltage signal terminal, and configured to provide the signal of the low voltage signal terminal to the second pull-down node under control of the pull-up node; and
- a second noise reduction sub-circuit coupled to the pull-up node, the second pull-down node, the low voltage signal terminal, and the output signal terminal and configured to provide the signal of the low voltage signal terminal to the output signal terminal and the pull-up node under control of the second pull-down node.

6. The shift register of claim 5, wherein the signal of the first modulation voltage signal terminal has a waveform inverse to that of the signal of the second modulation voltage signal terminal.

7. A gate driving circuit, comprising a plurality of cascaded shift registers, each of the cascaded shift registers being the shift register of claim 6.

8. The shift register of claim 5, wherein the second pull-down node control circuit comprises:
- an eighteenth transistor having a gate electrode and a second electrode coupled to the second pull-down node, and a first electrode coupled to the low voltage signal terminal; and
- a third capacitor having a first end coupled to the second pull-down node, and a second end coupled to the reset signal terminal.

9. The shift register of claim 8, wherein
the first modulation sub-circuit comprises a fifth transistor and a sixth transistor, the fifth transistor has a gate electrode coupled to a second electrode of the sixth transistor, a first electrode coupled to the first modulation voltage signal terminal, and a second electrode coupled to the first pull-down node, and the sixth transistor has a gate electrode and a first electrode coupled to each other, and the first electrode of the sixth transistor is coupled to the first modulation voltage signal terminal, the first suppression sub-circuit comprises a seventh transistor and an eighth transistor, the seventh transistor has a gate electrode coupled to the pull-up node, a first electrode coupled to the low voltage signal terminal, and a second electrode coupled to the first pull-down node, and the eighth transistor has a gate electrode coupled to the pull-up node, a first electrode coupled to the low voltage signal terminal, and a second electrode coupled to the second electrode of the sixth transistor, the first noise reduction sub-circuit comprises a tenth transistor and a sixteenth transistor, the tenth transistor has a gate electrode coupled to the first pull-down node, a first electrode coupled to the low voltage signal terminal, and a second electrode coupled to the pull-up node, and the sixteenth transistor has a gate electrode coupled to the first pull-down node, a first electrode coupled to the low voltage signal terminal, and a second electrode coupled to the output signal terminal, the second modulation sub-circuit comprises a twelfth transistor and a thirteenth transistor, the twelfth transistor has a gate electrode coupled to a second electrode of the thirteenth transistor, a first electrode coupled to the second modulation voltage signal terminal, and a second electrode coupled to the second pull-down node, and the thirteenth transistor has a gate electrode and a first electrode coupled to each other, and the first electrode of the thirteenth transistor is coupled to the second modulation voltage signal terminal, the second suppression sub-circuit comprises a fourteenth transistor and a fifteenth transistor, the fourteenth transistor has a gate electrode coupled to the pull-up node, a first electrode coupled to the low voltage signal terminal, and a second electrode coupled to the second pull-down node, and the fifteenth transistor has a gate electrode coupled to the pull-up node, a first electrode coupled to the low voltage signal terminal, and a second electrode coupled to the second electrode of the thirteenth transistor, and the second noise reduction sub-circuit comprises a ninth transistor and a seventeenth transistor, the ninth transistor has a gate electrode coupled to the second pull-down node, a first electrode coupled to the low voltage signal terminal, and a second electrode coupled to the pull-up node, and the seventeenth transistor has a gate electrode coupled to the second pull-down node, a first electrode coupled to the low voltage signal terminal, and a second electrode coupled to the output signal terminal.

10. A gate driving circuit, comprising a plurality of cascaded shift registers, each of the cascaded shift registers being the shift register of claim 9.

11. A gate driving circuit, comprising a plurality of cascaded shift registers, each of the cascaded shift registers being the shift register of claim 5.

12. A gate driving circuit, comprising a plurality of cascaded shift registers, each of the cascaded shift registers being the shift register of claim 2.

13. The shift register of claim 1, wherein the input circuit comprises a first transistor having a gate electrode and a first electrode coupled to the input signal terminal and a second electrode coupled to the pull-up node.

14. The shift register of claim 1, wherein the pull-up circuit comprises a third transistor and a first capacitor,
the third transistor has a gate electrode coupled to the pull-up node, a first electrode coupled to the clock signal terminal, and a second electrode coupled to the output signal terminal, and
the first capacitor has a first end coupled to the pull-up node, and a second end coupled to the output signal terminal.

15. The shift register of claim 1, wherein the reset circuit comprises a first reset sub-circuit and a second reset sub-circuit, the first reset sub-circuit comprises a second transistor, and the second reset sub-circuit comprises a fourth transistor,
the second transistor has a gate electrode coupled to the reset signal terminal, a first electrode coupled to the low voltage signal terminal, and a second electrode coupled to the pull-up node, and
the fourth transistor has a gate electrode coupled to the reset signal terminal, a first electrode coupled to the low voltage signal terminal, and a second electrode coupled to the output signal terminal.

16. A gate driving circuit, comprising a plurality of cascaded shift registers, each of the cascaded shift registers being the shift register of claim 1.

17. A display device, comprising the gate driving circuit of claim 16.

18. A method of driving a shift register, the shift register comprising:
- an input circuit coupled to an input signal terminal and a pull-up node, and configured to provide a signal of the input signal terminal to the pull-up node;
- a pull-up circuit coupled to a clock signal terminal, an output signal terminal, and the pull-up node, and configured to provide a signal of the clock signal terminal to the output signal terminal under control of the pull-up node;
- a reset circuit coupled to a reset signal terminal, the pull-up node, the output signal terminal, and a low voltage signal terminal, and configured to provide a signal of the low voltage signal terminal to the output signal terminal and the pull-up node under control of a signal of the reset signal terminal, the signal of the low voltage signal terminal having a constant first level;
- at least one noise reduction circuit coupled to a modulation voltage signal terminal, the low voltage signal terminal, the output signal terminal, the pull-up node, and at least one pull-down node, and configured to control the at least one pull-down node according to a signal of the modulation voltage signal terminal and a signal of the pull-up node, and provide the signal of the low voltage signal terminal to the output signal terminal and the pull-up node under control of the at least one pull-down node; and
- at least one pull-down node control circuit coupled to the at least one pull-down node, the low voltage signal terminal, and the reset signal terminal, and configured to control a voltage level of the at least one pull-down node according to the signal of the reset signal terminal, wherein the at least one pull-down node comprises a first pull-down node, the at least one pull-down node control circuit comprises a first pull-down node control circuit coupled to the first pull-down node, the low voltage signal terminal, and the reset signal terminal, and configured to control a voltage level of the first pull-down node according to the signal of the reset signal terminal, and the at least one noise reduction circuit comprises a first noise reduction circuit, the first noise reduction circuit comprising:
- a first modulation sub-circuit coupled to a first modulation voltage signal terminal and the first pull-down node, and configured to provide a signal of the first modulation voltage signal terminal to the first pull-down node;
- a first suppression sub-circuit coupled to the pull-up node, the first pull-down node, and the low voltage signal terminal, and configured to provide the signal of the low voltage signal terminal to the first pull-down node under control of the pull-up node; and
- a first noise reduction sub-circuit coupled to the first pull-down node, the pull-up node, the low voltage signal terminal, and the output signal terminal and configured to provide the signal of the low voltage signal terminal to the output signal terminal and the pull-up node under control of the first pull-down node, the method comprising:
- in a pull-up phase, providing an on level through the input signal terminal, and pulling up the pull-up node through the input circuit;
- in an output phase, providing the on level through the clock signal terminal, and outputting a shift signal with the on level through the output signal terminal;
- in a noise reduction initial phase, providing the on level through the reset signal terminal, resetting the pull-up node and the output signal terminal through the at least one noise reduction circuit, and controlling, by the at least one pull-down node control circuit, the at least one pull-down node to be at a second level higher than or equal to the on level; and
- in a noise reduction maintaining phase, controlling, by the at least one pull-down node control circuit, the at least one pull-down node to be at a third level, the third level being between the first level and the on level.

* * * * *